(12) United States Patent
Ishida

(10) Patent No.: US 7,204,627 B2
(45) Date of Patent: Apr. 17, 2007

(54) LAMP UNIT FOR FORMING A CUT-OFF LINE AND VEHICULAR HEADLAMP USING THE SAME

(75) Inventor: Hiroyuki Ishida, Shizuoka (JP)

(73) Assignee: Koito Manufacturing Co., Ltd., Shizuoka (JP)

( * ) Notice: Subject to any disclaimer, the term of this patent is extended or adjusted under 35 U.S.C. 154(b) by 185 days.

(21) Appl. No.: 10/940,112

(22) Filed: Sep. 14, 2004

(65) Prior Publication Data

US 2005/0068786 A1 Mar. 31, 2005

(30) Foreign Application Priority Data

Sep. 29, 2003 (JP) .............................. 2003-338449

(51) Int. Cl.
*F21V 1/00* (2006.01)
(52) U.S. Cl. ........................ 362/509; 362/538; 362/545
(58) Field of Classification Search ................ 362/507, 362/545, 800, 538, 509
See application file for complete search history.

(56) References Cited

U.S. PATENT DOCUMENTS 6,619,825 B2 * 9/2003 Natsume ..................... 362/509
6,819,505 B1 * 11/2004 Cassarly et al. ............. 359/726
6,819,506 B1 * 11/2004 Taylor et al. ................ 359/726
6,951,416 B2 * 10/2005 Sazuka et al. .............. 362/538
6,960,007 B2 * 11/2005 Ishida et al. ................ 362/538
2001/0028565 A1 10/2001 Ishida
2004/0213001 A1 * 10/2004 Sayers et al. ............... 362/334

FOREIGN PATENT DOCUMENTS

JP 2003-31007 1/2003

\* cited by examiner

*Primary Examiner*—Ali Alavi
(74) *Attorney, Agent, or Firm*—Osha Liang LLP

(57) ABSTRACT

A lamp unit for a vehicular headlamp includes a projection lens disposed on an optical axis extending in a vehicle longitudinal direction and a semiconductor light-emitting element having a light-emitting chip with a lower end edge formed linearly. The semiconductor light-emitting element is disposed in the rear of the projection lens facing forward so as to position the lower end edge 24a1 on the optical axis. The projection lens projects light from a point on the optical axis of the lower end edge within a vertical cross section as parallel light, and projects light from a point on the optical axis of the lower end edge within a horizontal cross section as diffused light.

15 Claims, 15 Drawing Sheets

LAMP UNIT FOR FORMING A CUT-OFF LINE AND VEHICULAR HEADLAMP USING THE SAME

BACKGROUND OF INVENTION

1. Field of the Invention

The present invention relates to a lamp unit of a vehicular headlamp used for forming a cut-off line.

2. Background Art

It is conventionally known that a vehicular headlamp, as disclosed in, for example, Patent Document 1, is configured to form the geometry of a light distribution pattern with a cut-off line on an upper area based on light radiated from a plurality of lamp units.

In addition, a vehicular lamp disclosed in Patent Document 2 is configured to reflect light radiated from a plurality of semiconductor light-emitting elements aligned in a horizontal direction toward the front of the lamp by a reflector.

Patent Document 1: Japanese Patent Laid-Open Publication No. 2001-270383

Patent Document 2: Japanese Patent Laid-Open Publication No. 2003-31007

Assuming that the vehicular lamp disclosed in Patent Document 2 is used for a vehicular headlamp, it may be possible to form the geometry of a light distribution pattern with a cut-off line on an upper area using a sort of downsized lamp configuration.

However, in the case of the vehicular lamp disclosed in Patent Document 2, the lamp configuration becomes complicated. Further, it is not easy to precisely control light distribution for forming the cut-off line.

SUMMARY OF INVENTION

In view of this situation, an object of the present invention is to provide a compact or downsized lamp unit of a vehicular lamp capable of precisely controlling light distribution for forming a cut-off line as it has a simple configuration.

The present invention achieves the above object by using a semiconductor light-emitting element for a light source and a projection lens for a light distribution control member respectively, and further contriving the disposition of the semiconductor light-emitting element and the configuration of projection lens.

In one aspect, the present invention provides a lamp unit for a vehicular headlamp, configured to form the geometry of a light distribution pattern including a predetermined cut-off line on an upper area. Specifically, the lamp unit of the vehicular headlamp used for forming the predetermined cut-off line comprises a projection lens disposed on an optical axis extending in a longitudinal direction of a vehicle, and a semiconductor light-emitting element, having a light-emitting chip with a lower end edge formed linearly, disposed the lower end edge on the optical axis and in the rear of the projection lens facing forward, and is configured to form at least a part of the cut-off line as an inverted projection image of the lower end edge of the light-emitting chip. The projection lens is configured to project light from a point on the optical axis of the lower end edge of the light-emitting chip as parallel light within a cross section perpendicular to the lower end edge of the light-emitting chip, while projecting light from a point on the optical axis of the lower end edge of the light-emitting chip as diffusion light within a cross section parallel to the lower end edge of the light-emitting chip.

The "light distribution pattern including a predetermined cut-off line on an upper area" may naturally signify a so-called low-beam distribution pattern or any other light distribution pattern.

A specific outline of the "predetermined cut-off line" is not particularly limited. Thus, various outlines, for example, an outline comprising a horizontal cut-off line extending in the horizontal direction and an oblique cut-off line extending in an inclined upward direction beginning at the horizontal cut-off line, a stepped shape with right and left pairs of horizontal cut-off lines in different levels, or the like can be adopted.

The "lamp unit" is "configured to form at least a part of the cut-off line." Meanwhile, when the lamp unit is configured to forms only a part of the cut-off line, other parts of the cut-off line may be formed by light radiated from lamp units of the same type of the above-mentioned "lamp unit," or formed by light radiated from lamp units of a different type.

A type of the "semiconductor light-emitting element" is not particularly limited. For example, a light-emitting diode, a laser diode, or the like can be adopted.

The specific characteristic of the "projection lens," such as material and shape, are not particularly limited, provided that the projection lens projects light from a point on the optical axis of the lower end edge of the light-emitting chip as parallel light within a cross section perpendicular to the lower end edge of the light-emitting chip, while projecting light from a point on the optical axis of the lower end edge of the light-emitting chip as diffusion light within a cross section parallel to the lower end edge of the light-emitting chip.

As mentioned above, the lamp unit according to the present invention comprises a projection lens disposed on an optical axis extending in a longitudinal direction of a vehicle and a semiconductor light-emitting element, having a light-emitting chip with a lower end edge formed in a linear shape, disposed the lower end edge on the optical axis Ax and in the rear of the projection lens facing forward, and is configured to form at least a portion of the cut-off line as an inverted projection image of the lower end edge of the light-emitting chip. Further, the projection lens is configured to project light from a point on the optical axis of the lower end edge of the light-emitting chip as parallel light within a cross section perpendicular to the lower end edge of the light-emitting chip, while projecting light from a point on the optical axis of the lower end edge of the light-emitting chip as diffusion light within a cross section parallel to the lower end edge of the light-emitting chip. Thus, it is possible to form a light distribution pattern extending along the cut-of line. Further, since this can be achieved through a simple optical system where the semiconductor light-emitting element is merely disposed in the rear of the projection lens, light distribution for forming the cut-off line can be precisely and easily controlled.

According to the present invention, the lamp unit of the vehicular headlamp for forming the cut-off line is downsized, and allows the light distribution to be precisely controlled using a simple configuration.

As mentioned above, the specific configuration or attribution of the projection lens is not particularly limited. However, if the projection lens is integrally configured by the seal resin for sealing the light-emitting chip, no members are required for holding a predetermined positional relationship between the projection lens and the semiconductor light-emitting element. Thus, the positional relationship between the projection lens and the semiconductor light-emitting element can be precisely set. Accordingly, this further facilitates formation of the cut-off line. In addition, costs can be reduced through decrease in parts or components and the lamp unit can be made even more downsized.

In one aspect of the present invention, the vehicular headlamp provided with a plurality of lamp unit can precisely control light distribution for the cut-off line, and it is possible to make the configuration of the overall vehicular headlamp downsized.

In this case, the vehicular headlamp may include a lamp unit, in which the lower end edge of the light-emitting chip extends in a horizontal direction, and another lamp unit, in which the lower end edge of the light-emitting chip extends in a direction inclined at a predetermined angle with respect to the horizontal direction. By way of this, it is possible to form a light distribution pattern with a horizontal cut-off line and an inclined cut-off line raised at an angle beginning at the horizontal cut-off line.

Additionally, in one aspect of the present invention, the plurality of lamp units may be all the same or similar configurations. Alternatively, they may be different configurations in whole or part.

In the case where the latter configuration is adopted, at least several the lamp units among the plurality of lamp units is configured to be in different refracting powers within a cross section parallel to the lower end edge of the light-emitting chip thereof. Thus, it is possible to form a specific geometry composed of a plurality of light distribution pattern, which are spread in respective directions along the cut-off lines. Accordingly, the formation of cut-off lines can be obtained depending on necessary and sufficient range.

Also, in one aspect of the present invention, at least several the lamp units among the plurality of lamp units is configured such that the light-emitting chips are in different sizes. Thus, it is possible to obtain light distribution patterns in different sizes formed by light radiated from each of the lamp units. Accordingly, the formation of cut-off lines can be obtained, curbing uneven light distribution as much as possible.

Moreover, in one aspect of the present invention, at least several the lamp units among the plurality of lamp units is configured such that the projection lens are in different sizes. Thus, it is possible to obtain light distribution patterns in different sizes formed by light radiated from each of the lamp units. Accordingly, the formation of cut-off lines can be obtained, curbing uneven light distribution as much as possible.

Other aspects and advantages of the invention will be apparent from the following description and the appended claims.

DETAILED DESCRIPTION

Hereinafter, an embodiment of the present invention will be described with reference to the drawings.

Figure 1:
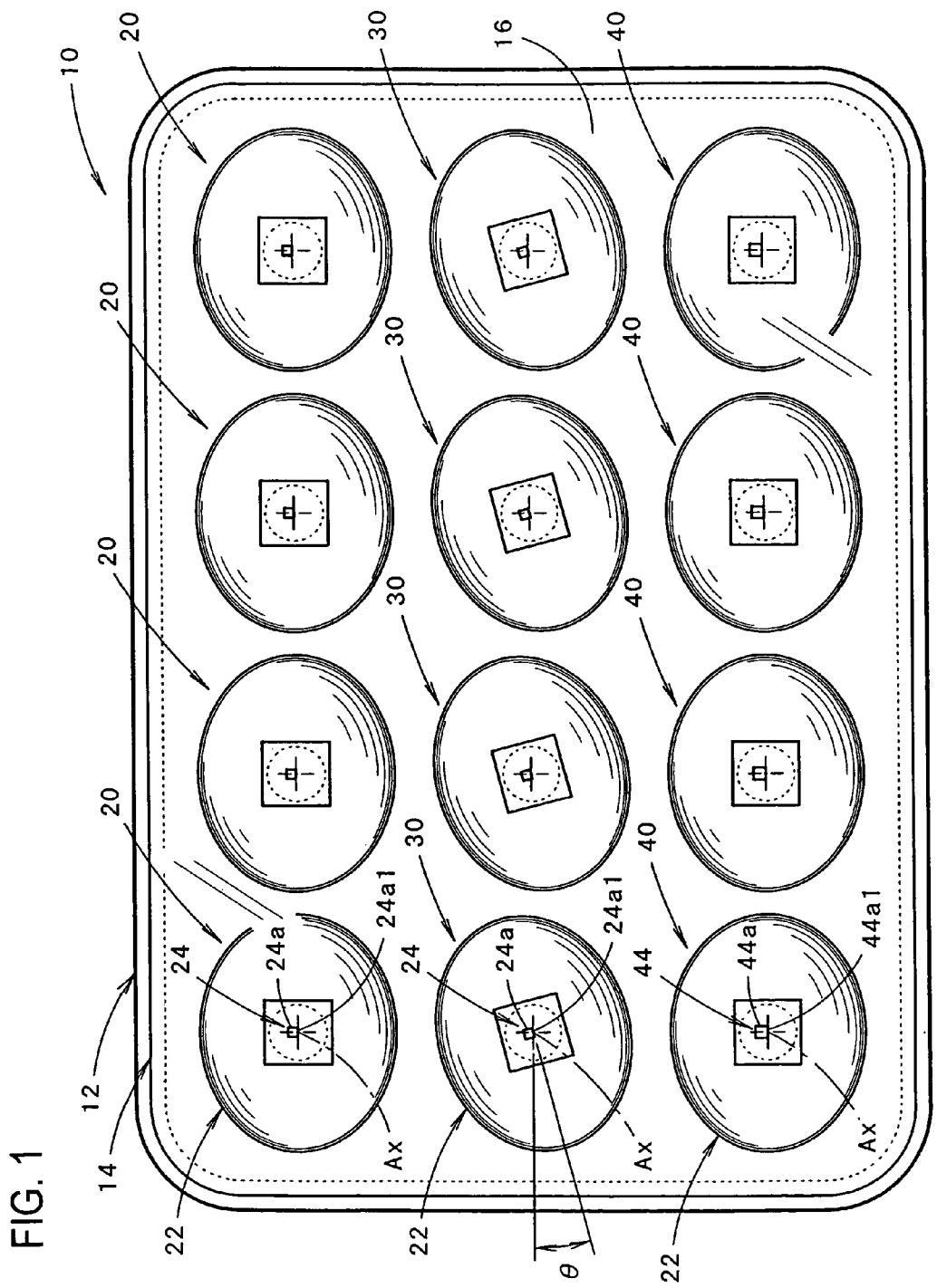
FIG. 1 is a front view showing a vehicular headlamp according to an embodiment of the present invention.

FIG. 1 is a front view showing a vehicular headlamp according to an embodiment of the present invention. As shown in the figure, a vehicular headlamp 10 is configured to accommodate 12 lamp units 20, 30, and 40 in three rows within a lamp chamber formed by a lamp body 12 and a translucent cover 14 attached to a front opening of the lamp body. Further, an inner panel 16 is provided in the lamp chamber so as to surround each of the lamp units 20, 30, and 40. In this embodiment, each of the four lamp units 20 disposed on the top row is the same in a configuration. Each of the four lamp units 30 disposed on the middle row and each of the four lamp units 40 disposed on the bottom row are the same in a configuration as well.

Figure 2:
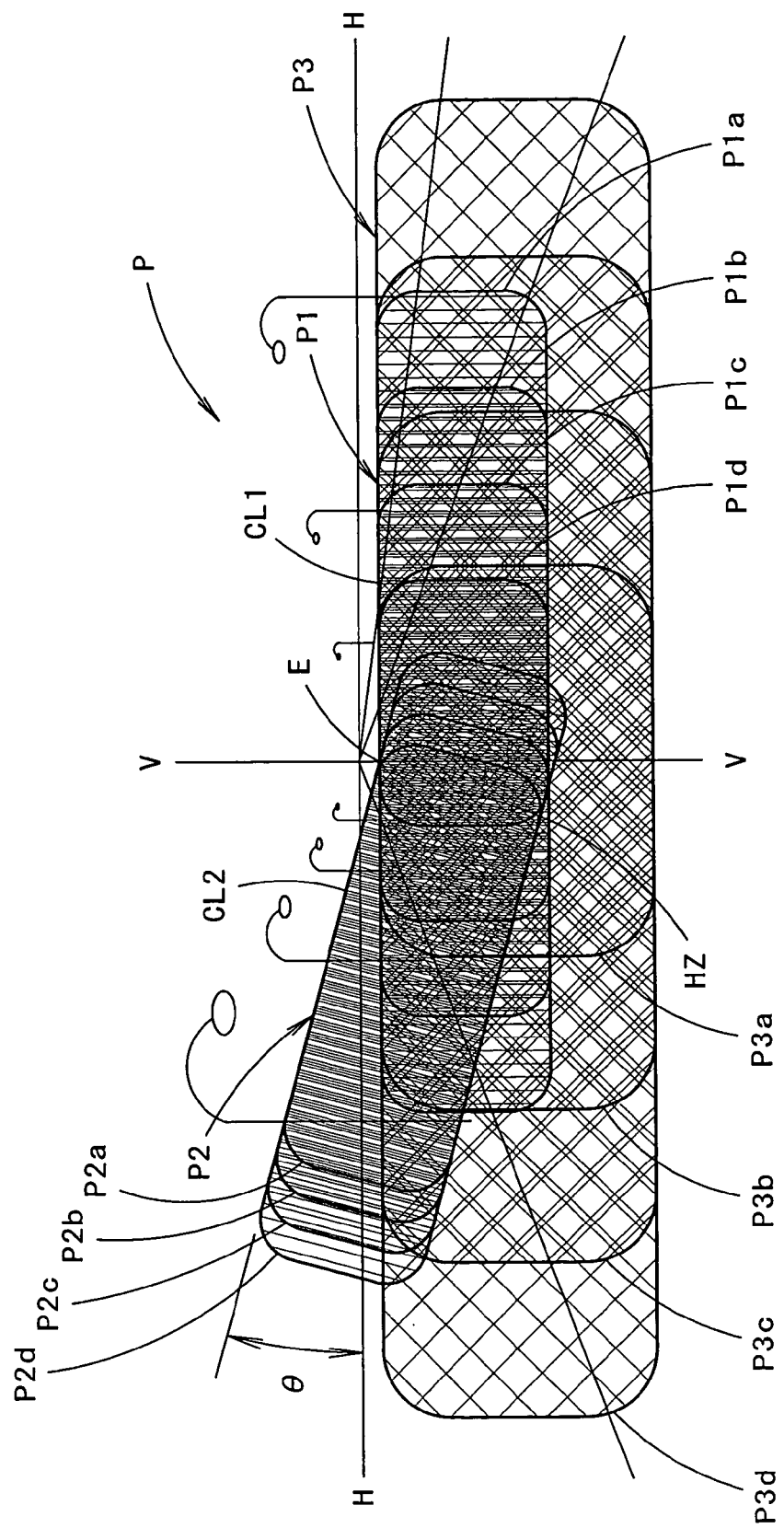
FIG. 2 is a perspective view showing the geometry of a light distribution pattern on a virtual vertical screen formed by light radiated from a vehicular headlamp.

FIG. 2 is a perspective view showing the geometry of a light distribution pattern P formed by light radiated forward from the vehicular headlamp 10 on a virtual vertical screen disposed at a distance of 25 meters from the front of the lamp. The light distribution pattern P is a low-beam distribution pattern for left-side light distribution. The light distribution pattern P includes a horizontal cut-off line CL1 on an upper end edge thereof and an oblique cut-off line CL2 inclined at a predetermined angle θ (for example, θ=15 degrees) extending from the horizontal cut-off line CL1. The an elbow point E, which is the intersection of both cut-off lines CL1 and CL2, is adjusted at approximately 0.5 to 0.6 degrees below H-V, which is a vanishing point in front of the lamp. Also, the light distribution pattern P has a hot zone HZ, which is an area of high-intensity light, is formed to somewhat offset leftward from, and surround, the elbow point E.

The light distribution pattern P is designed as a synthesized light distribution pattern comprising a pattern P1 for forming a horizontal cut-off line, a pattern P2 for forming an oblique cut-off line, and a pattern P3 for forming a diffusion zone.

The pattern P1 for forming a horizontal cut-off line is a light distribution pattern for forming the horizontal cut-off line CL1 of the low-beam distribution pattern P. The pattern P1 is composed of four small light distribution patterns P1a, P1b, P1c, and P1d formed by light radiated from the four lamp units 20 disposed in the top row. Each of the small light distribution patterns P1a, P1b, P1c, and P1d is a horizontally oblong-shaped light distribution pattern having a sharp or distinct cut-off line on an upper area thereof, and formed to positionally offset in the horizontal direction so as to partially overlap. Further, the horizontal cut-off line CL1 is sharply formed by the upper end edges of the small light distribution patterns P1a, P1b, P1c, and P1d.

The pattern P2 for forming an oblique cut-off line is a light distribution pattern for forming the oblique cut-off line CL2 of the low-beam distribution pattern P. The pattern P2 is composed four small light distribution patterns P2a, P2b, P2c, and P2d formed by light radiated from the four lamp units 30 disposed in the middle row. Each of the small light distribution patterns P2a, P2b, P2c, and P2d is a horizontally oblong-shaped light distribution pattern having a cut-off line on an upper area thereof, and formed to positionally offset in an oblique direction inclined at the predetermined angle θ with respect to the horizontal direction (hereinafter simply referred to as an oblique direction) so as to partially overlap. Further, the oblique cut-off line CL2 is sharply formed from the upper end edges of the small light distribution patterns P2a, P2b, P2c, and P2d. In this case, the four small light distribution patterns P2a, P2b, P2c, and P2d are relatively more overlapped than the four small light distribution patterns P1a, P1b, P1c, and P1d, which create the pattern P1 for forming a horizontal cut-off line, for the sake of obtaining a higher intensity light in the hot zone HZ.

The pattern P3 for forming a diffusion zone is a light distribution pattern for forming the diffusion zone of the low-beam distribution pattern P. The pattern P3 is composed of four small light distribution patterns P3a, P3b, P3c, and P3d formed by light radiated from the four lamp units 40 disposed in the bottom row. The pattern P3 is also formed as a light distribution pattern broadly expanding in the right and left directions below the horizontal cut-off line CL1. Each of the small light distribution patterns P3a, P3b, P3c, and P3d is horizontally oblong-shapes larger than each of the small light distribution patterns P1a, P1b, P1c, and P1d, which generate the pattern P1 for forming a horizontal cut-off line, and formed to positionally offset in the horizontal direction so as to partially overlap. Each of the small light distribution patterns P3a, P3b, P3c, and P3d also has sharp cut-off lines on upper area thereof. Thus, the horizontal cut-off line CL1 is more sharply formed by the upper end edge of the pattern P3 for forming a diffusion zone.

Hereinafter, each of lamp units 20, 30, and 40 will be described in detail.

First, the configuration of one of the lamp units 20 for forming a horizontal cut-off line will be described.

Figure 3:
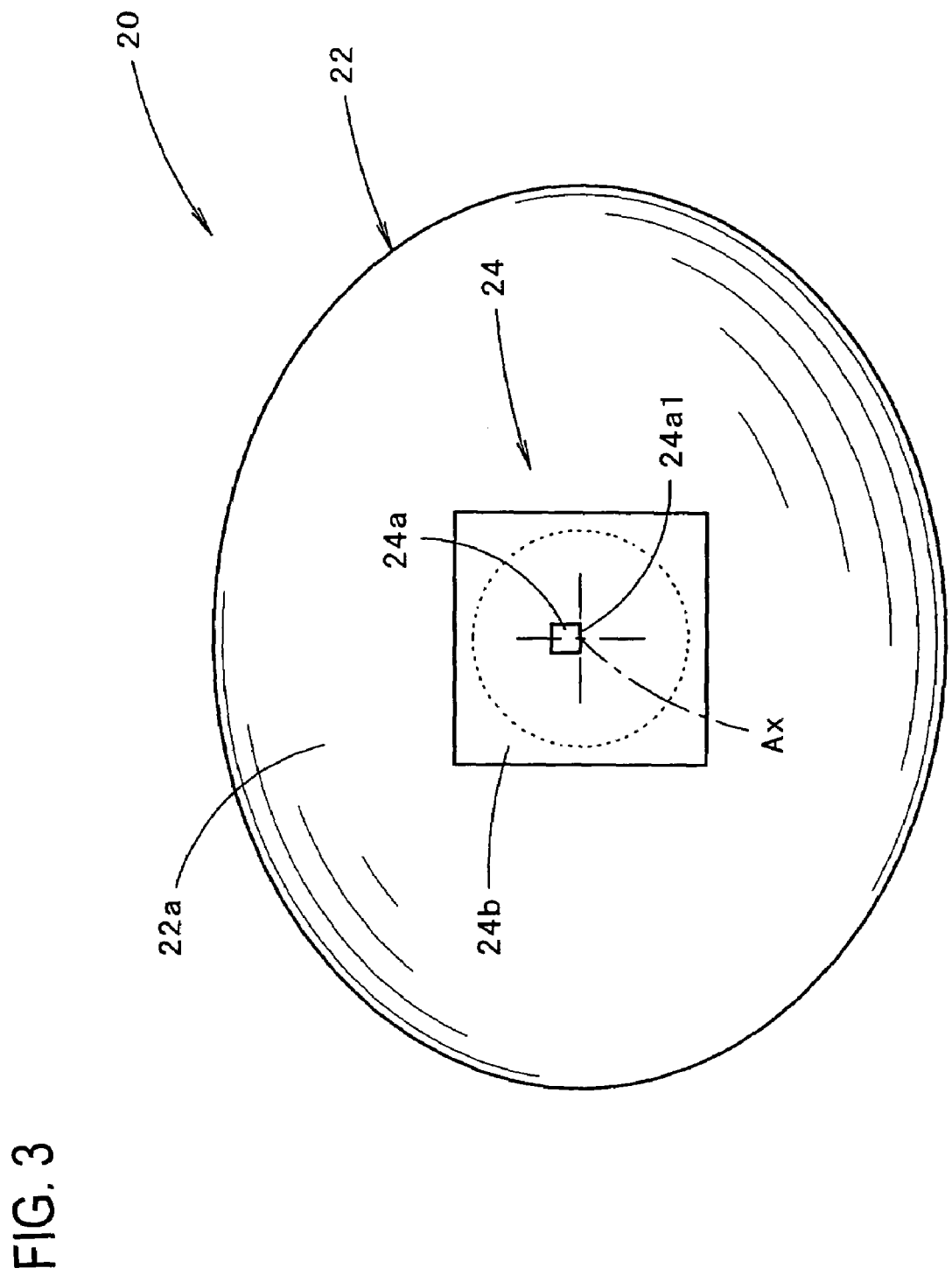
FIG. 3 is a front view showing one of lamp units for forming a horizontal cut-off line of the vehicular headlamp.
Figure 4:
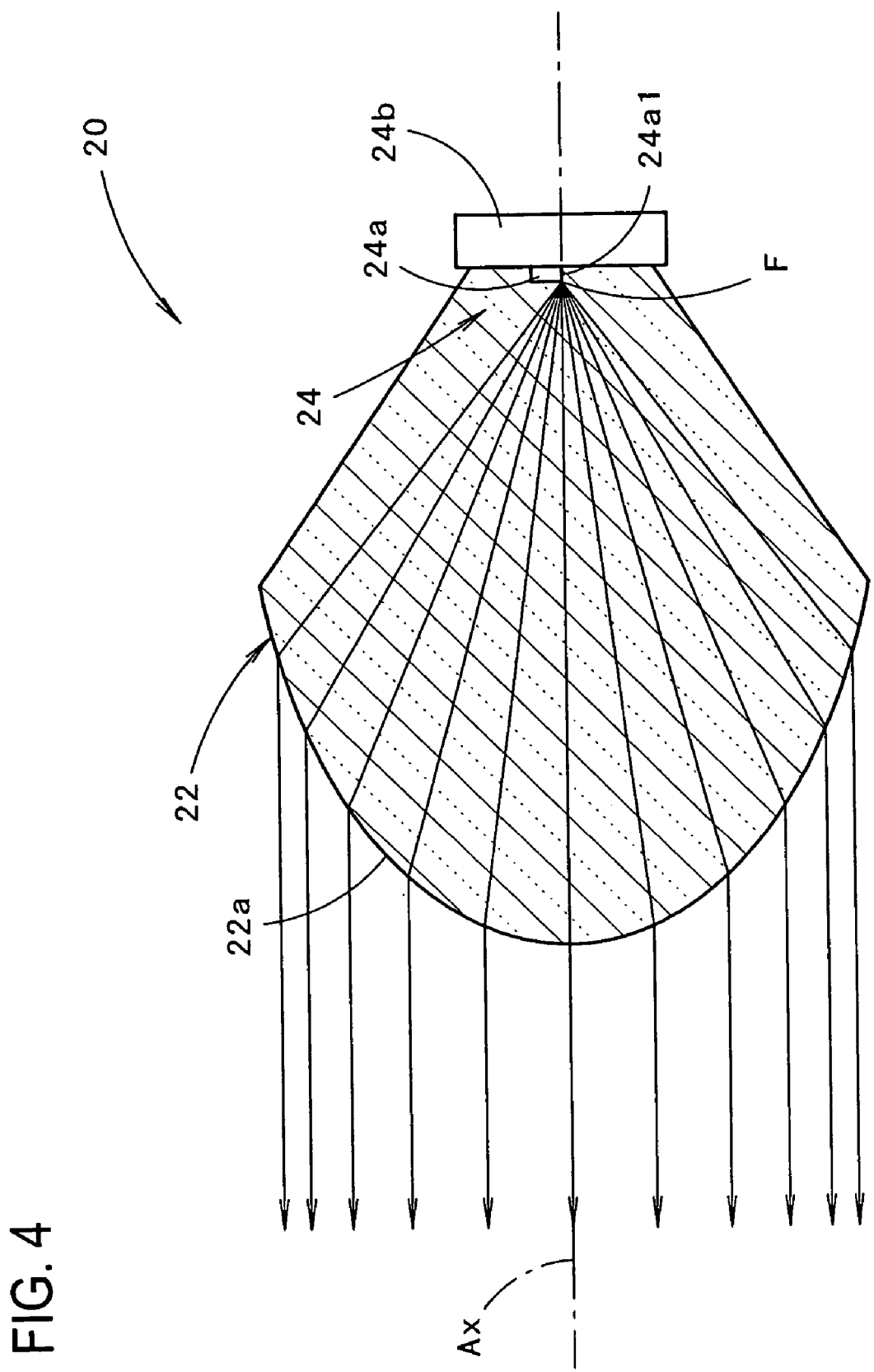
FIG. 4 is a cross-sectional side view showing the lamp unit of FIG. 3.
Figure 5:
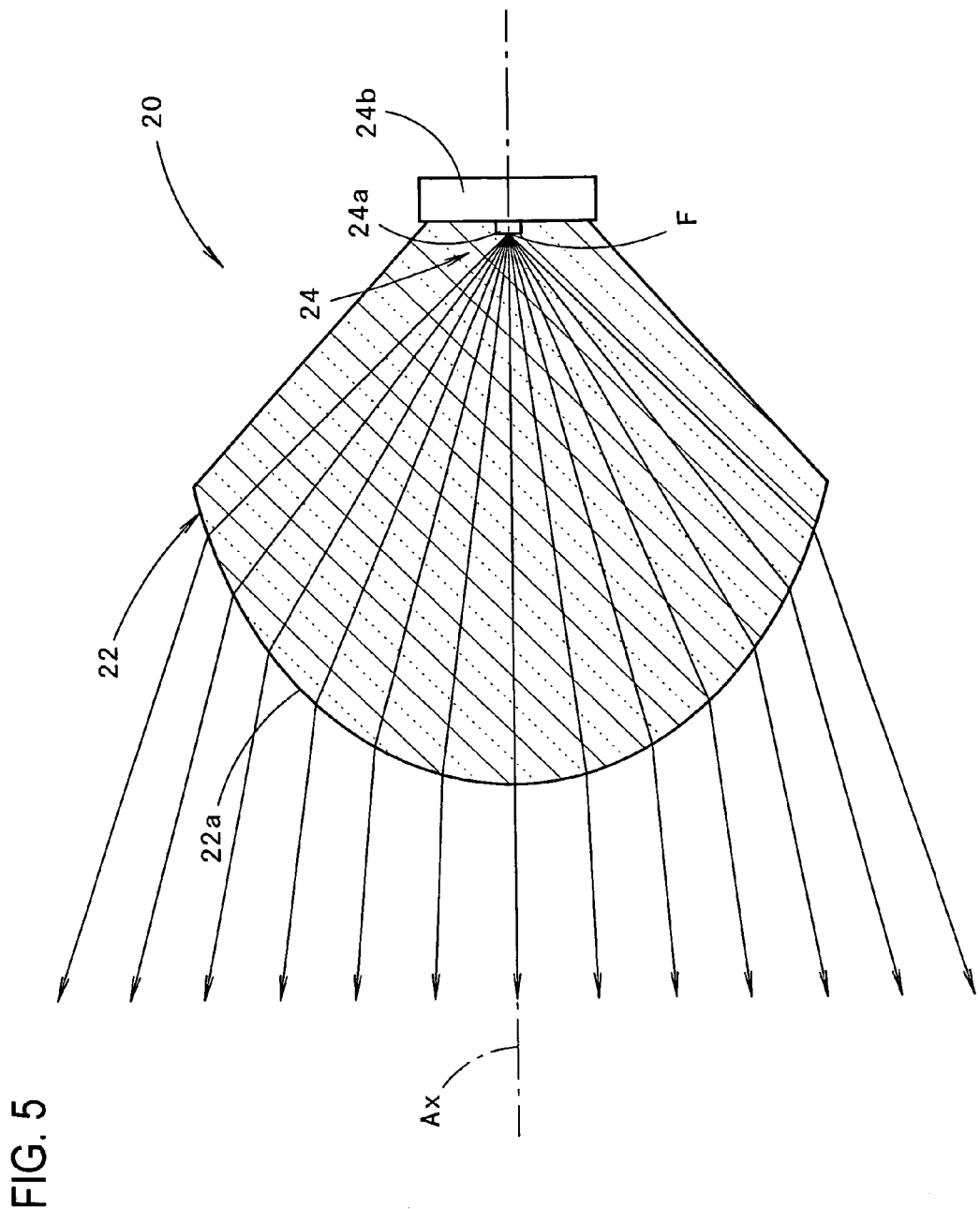
FIG. 5 is a cross-sectional plan view showing the lamp unit of FIG. 3.

FIGS. 3, 4 and 5 are a front, a cross-sectional side, and a cross-sectional plan views, respectively, showing one of lamp units 20.

As shown in these figures, the lamp unit 20 includes a projection lens 22 disposed on an optical axis Ax extending in a longitudinal direction of a vehicle, and a semiconductor light-emitting element 24 disposed in the rear of the projection lens 22 facing forward.

The semiconductor light-emitting element 24 is, typically, a white light-emitting diode, configured to mount a light-emitting chip 24a approximately 0.3 to 1 millimeters on a side on the front surface of a base plate 24b disposed perpendicular to the optical axis Ax, and a center point in the horizontal direction of a lower end edge 24a1 of the light-emitting chip 24a is positioned on the optical axis Ax.

The projection lens 22 is a molded component made of transparent resin. A front-side surface 22a of the projection lens 22 is formed in a substantially ellipsoid spherical shape, and a rear-side surface thereof is formed in a substantially ellipsoid conical shape. The rear end portion of the projection lens 22 is attached to the base plate 24b of the semiconductor light-emitting element 24. The projection lens 22 can also serve as a seal resin for sealing the light-emitting chip 24a of the semiconductor light-emitting element 24.

Regarding the front-side top surface 22a of the projection lens 22, a shape of a vertical cross section thereof including the optical axis Ax is composed of a substantially elliptical arc-shaped curve, which has a focal point F at the center point in the horizontal direction of the lower end edge 24a1 of the light-emitting chip 24a. Further, a shape of the horizontal cross section of the front-side surface 22a of the projection lens 22 including the optical axis Ax is composed of a substantially elliptical arc-shaped curve, which has a smaller curvature than that of the shape in the vertical cross section. Thus, the projection lens 22 can project, as parallel light, light from a point on the optical axis Ax of the lower end edge 24a1 of the light-emitting chip 24a within a cross section perpendicular to the lower end edge 24a1 of the light-emitting chip 24a, while projecting, as diffused light, light from a point on the optical axis Ax of the lower end edge 24a1 of the light-emitting chip 24a within a cross section parallel to the lower end edge 24a1 of the light-emitting chip 24a.

Figure 6:
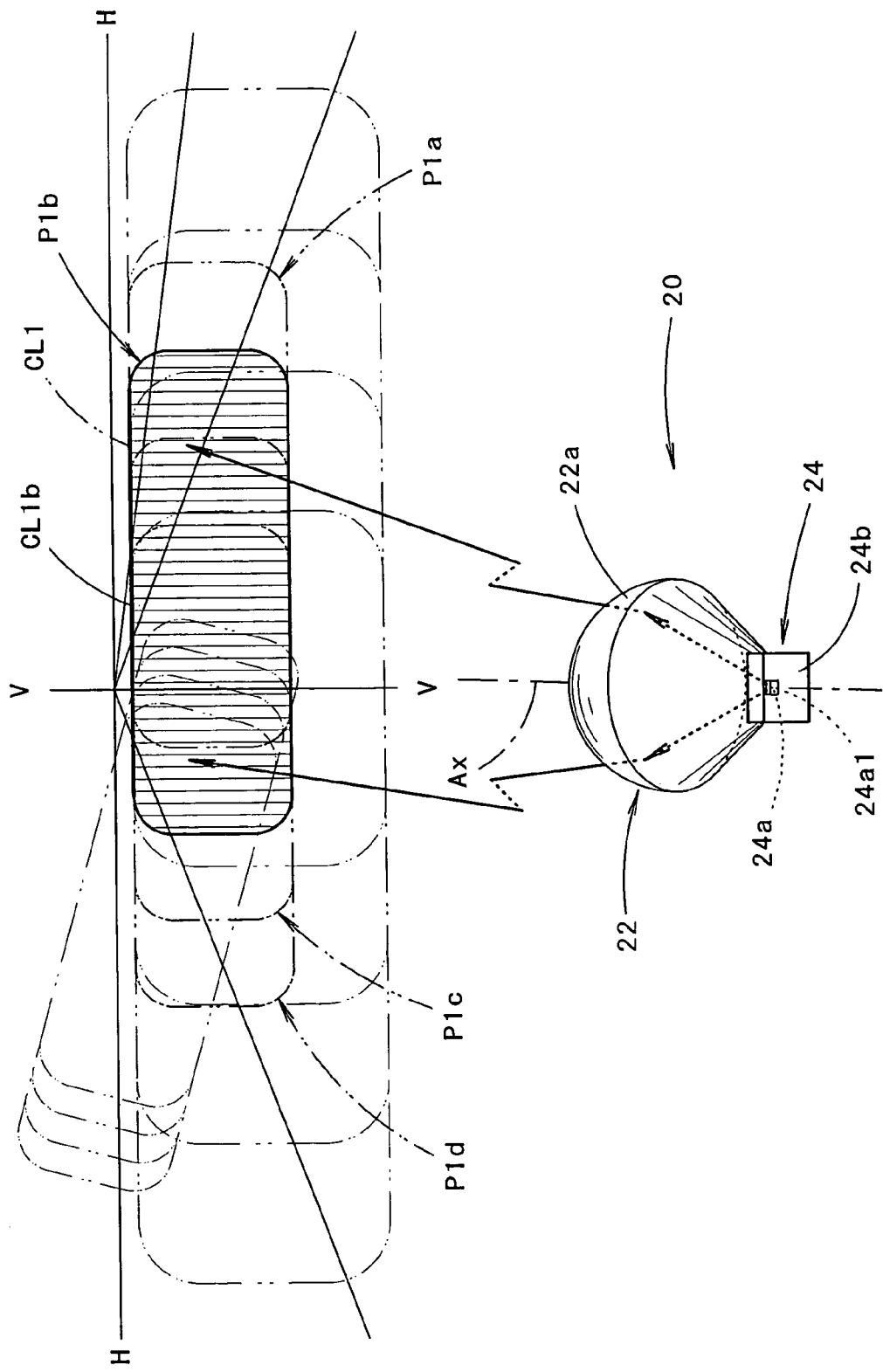
FIG. 6 is a perspective view showing the geometry of a light distribution pattern on a virtual vertical screen formed by light radiated from the lamp unit of FIG. 3.

FIG. 6 is a perspective view from behind the lamp unit 20 on the virtual vertical screen, showing a small light distribution pattern P1b formed by light radiated from the lamp unit 20, which is positioned second from the right among the four lamp units 20.

As shown in the figure, the lamp unit 20 is configured to form the small light distribution pattern P1b as an inverted projection image of the light-emitting chip 24a. The small light distribution pattern P1b is a horizontally oblong light distribution pattern expanding only in the horizontal direction due to the effect of the projection lens 22, and a cut-off line CL1b, which is an inverted projection image of the lower end edge 24a1 of the light-emitting chip 24a disposed across the optical axis Ax, is sharply formed on an upper area thereof.

In the lamp unit 20 shown in the same figure, the optical axis Ax is adjusted extending somewhat downward and rightward with respect to the longitudinal direction of the vehicle. In addition, the four small light distribution patterns P1a, P1b, P1c, and P1d are formed in a manner of angularly offsetting the orientation of the optical axis Ax in the horizontal direction among the four lamp units 20.

Next, the configuration of the lamp unit 30 for forming an oblique cut-off line will be described.

As shown in FIG. 1, a configuration of the lamp unit 30 is a similar to that of the lamp unit 20 for forming a horizontal cut-off line, as is rotated a predetermined angle θ clockwise.

Figure 7:
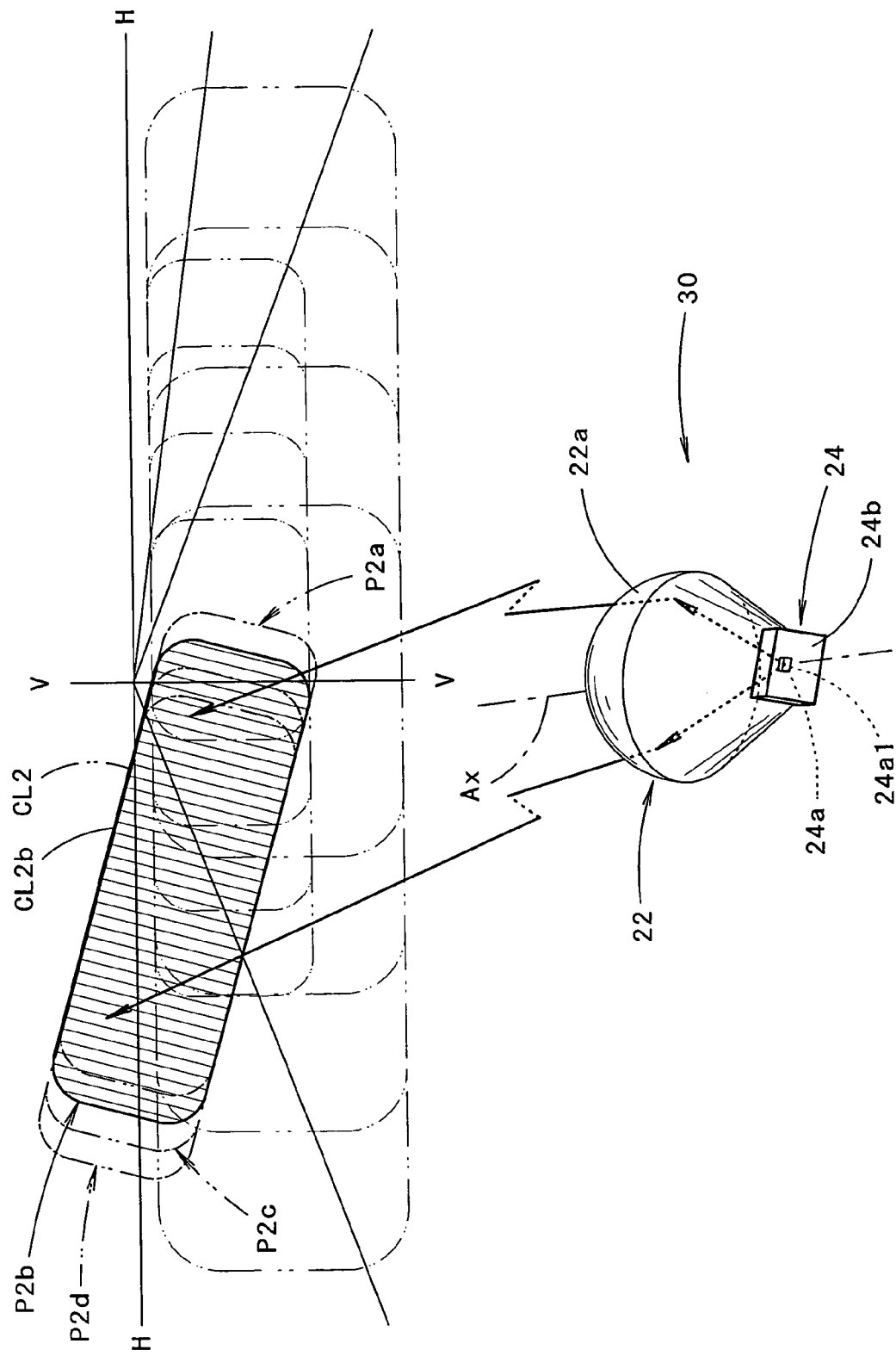
FIG. 7 is a perspective view showing the geometry of a light distribution pattern on a virtual vertical screen formed by light radiated from a lamp unit for forming an oblique cut-off line of the vehicular headlamp.

FIG. 7 is a perspective view from behind the lamp unit 30 on the virtual vertical screen, showing a small light distribution pattern P2b formed by light radiated from the lamp unit 30, which is positioned second from the right among the four lamp units 30.

As shown in the figure, the lamp unit 30 is configured to form the small light distribution pattern P2b as an inverted projection image of the light-emitting chip 24a. The small light distribution pattern P2b is a horizontally oblong light distribution pattern expanding only in an oblique direction due to the effect of the projection lens 22, and a cut-off line CL2b, which is an inverted projection image of the lower end edge 24a1 of the light-emitting chip 24a disposed across the optical axis Ax, is sharply formed on an upper area.

In the lamp unit 30 shown in the same figure, the optical axis Ax is adjusted extending somewhat to the left with respect to the vehicle longitudinal direction. In addition, the four small light distribution patterns P2a, P2b, P2c, and P2d are formed in a manner of angularly offsetting the orientation of the optical axis Ax in an oblique direction among the four lamp units 30.

Next, the configuration of the lamp unit 40 for forming a diffusion zone will be described.

Figure 8:
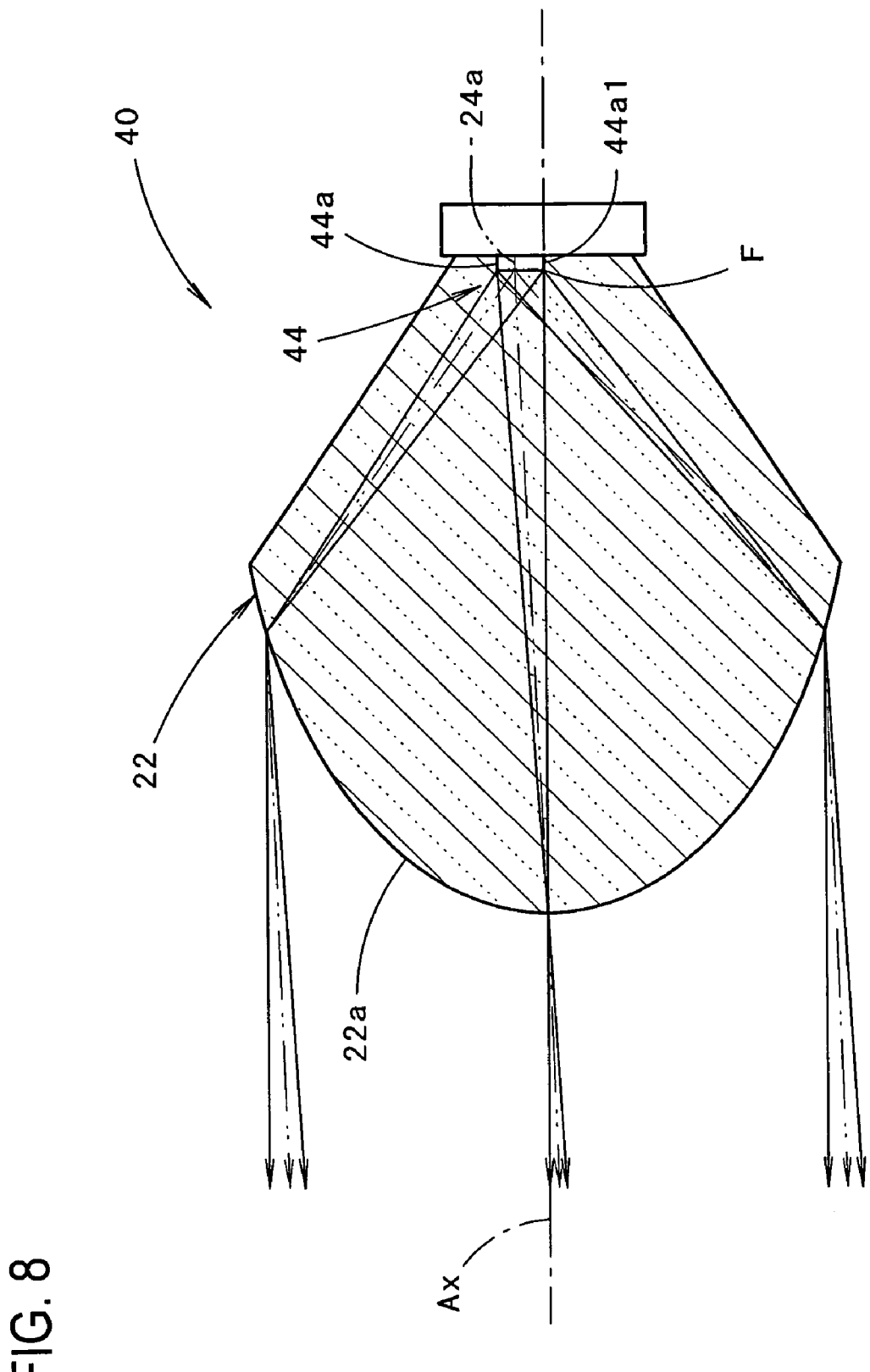
FIG. 8 is a cross-sectional side view showing one of lamp units for forming a diffusion zone of the vehicular headlamp.
Figure 9:
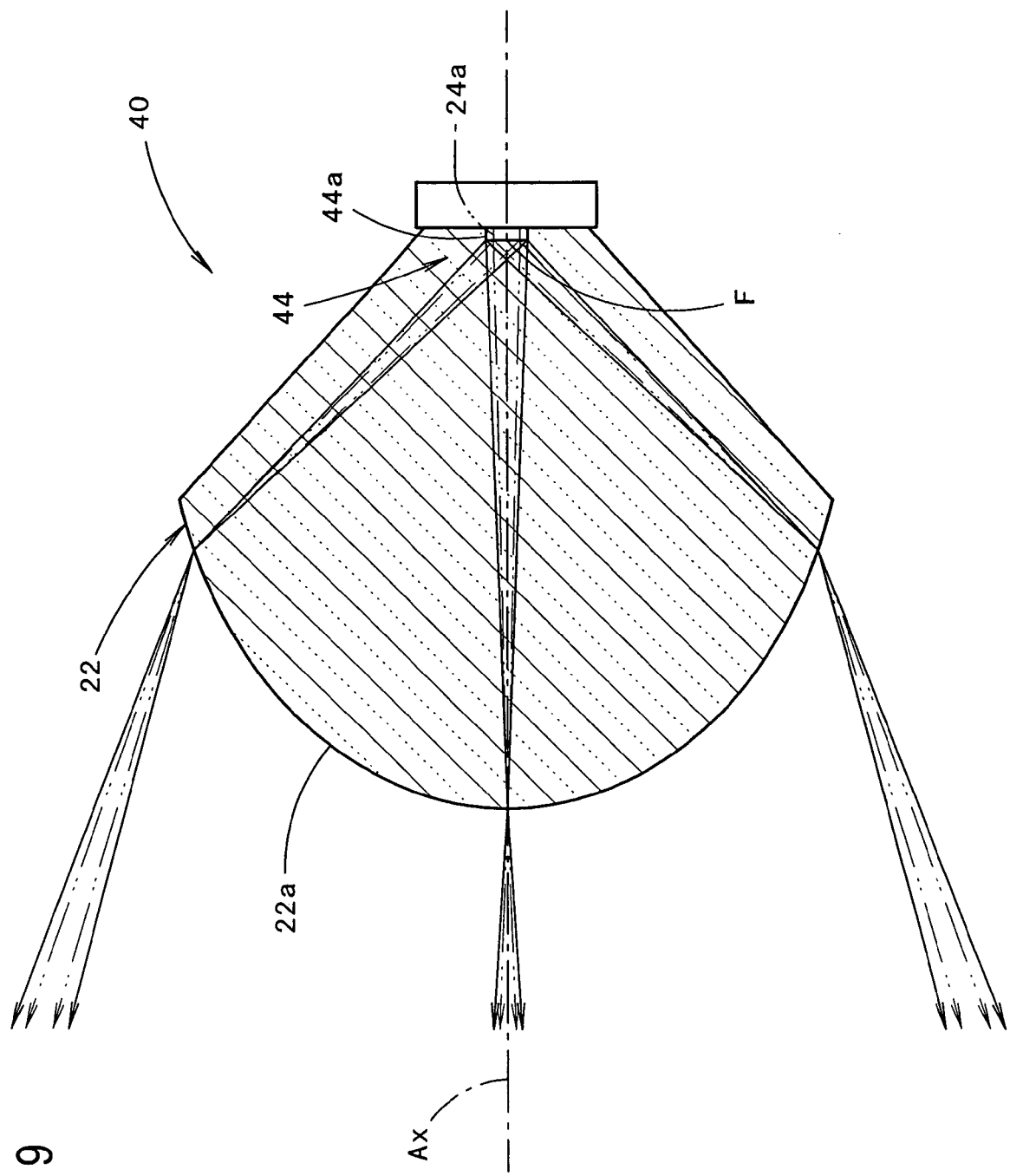
FIG. 9 is a cross-sectional plan view showing the lamp unit of FIG. 8.

FIGS. 8 and 9 are cross-sectional side and plane views showing one of the lamp units 40 respectively. As shown in these figures, the basic configuration of the lamp unit 40 is similar to that of the lamp unit 20 for forming a horizontal cut-off line, but a configuration of a semiconductor light-emitting element 44 differs from that in the lamp unit 20.

Specifically, the semiconductor light-emitting element 44 of the lamp unit 40, as with the semiconductor light-emitting element 24 of the lamp unit 20, is disposed on the optical axis Ax at a center position in the horizontal direction of a lower end edge 44a1 of a light-emitting chip 44a. However, outer dimensions of the light-emitting chip 44a is larger than that of the light-emitting chip 24 of the semiconductor light-emitting element 24 (e.g., approximately 0.5 to 1.6 millimeters on a side).

Figure 10:
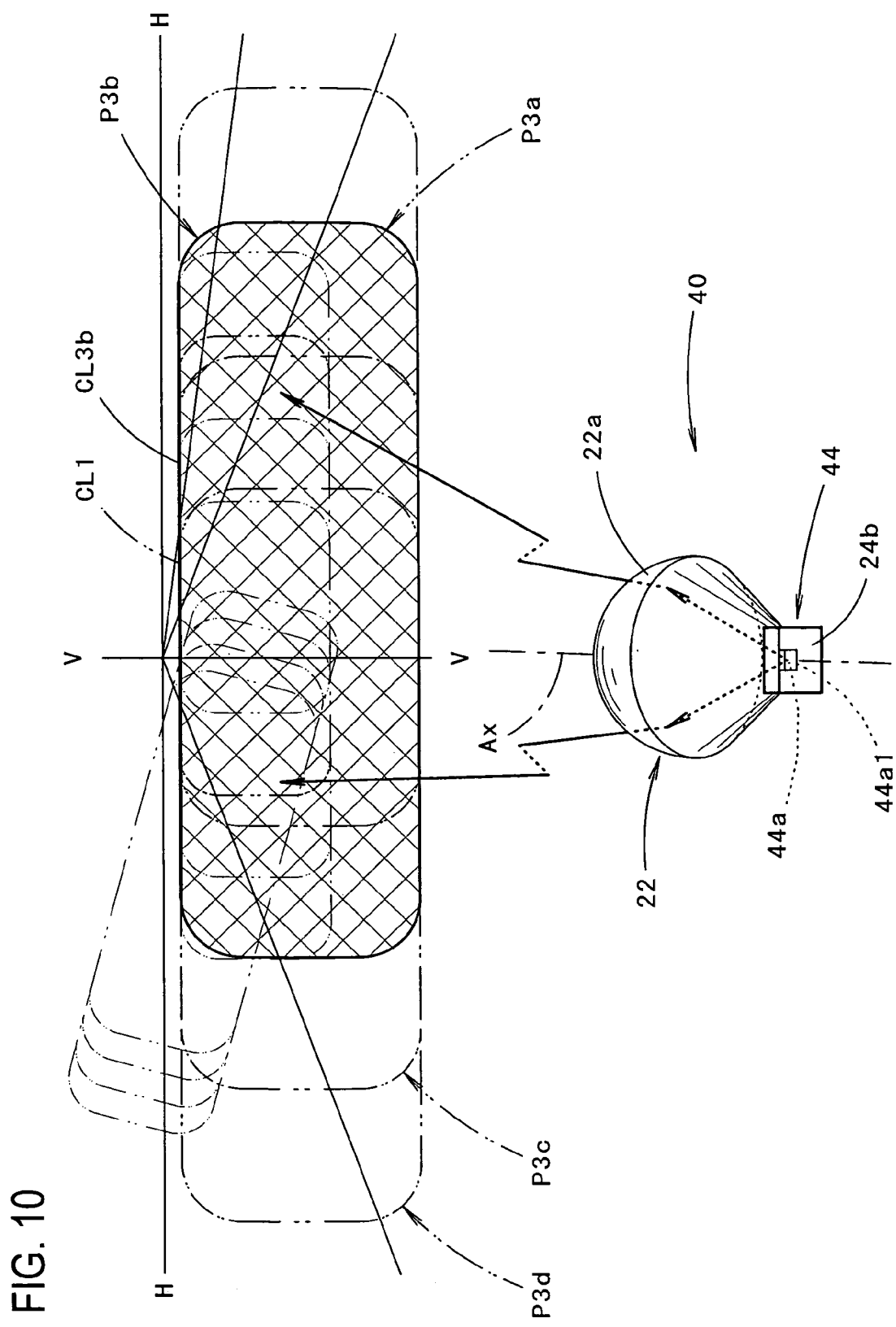
FIG. 10 is a perspective view showing the geometry of a light distribution pattern on the virtual vertical screen formed by light radiated from a lamp unit for forming a diffusion zone of the vehicular headlamp.

FIG. 10 is a perspective view from behind the lamp unit 40 on the virtual vertical screen, showing a small light distribution pattern P3b formed by light radiated from the lamp unit 40, which is positioned second from the right among the four lamp units 40.

As shown in the figure, the lamp unit 40 is configured to form the small light distribution pattern P3b as an inverted projection image of the light-emitting chip 44a. The small light distribution pattern P3b is a horizontally oblong light distribution pattern expanding only in the horizontal direction due to the effect of the projection lens 22, and a cut-off line CL3b, which is an inverted projection image of the lower end edge 44a1 of the light-emitting chip 44a disposed across the optical axis Ax, is sharply formed on an upper area.

The light-emitting chip 44a is a size larger than the light-emitting chip 24a, as shown in FIGS. 8 and 9. Thus, light radiated from each of the light-emitting chip 44a is projected from the projection lens 22 so as to expand more than light (shown in the figure with a two-dot dashed line) radiated from position of the light-emitting chip 24a. Accordingly, the small light distribution pattern P3b is a size larger than the small light distribution pattern P1b.

In the lamp unit 40 shown in FIG. 10, the optical axis Ax is adjusted extending somewhat downward and rightward with respect to the longitudinal direction of the vehicle. In addition, the four small light distribution patterns P3a, P3b, P3c, and P3d are formed in a manner of angularly offsetting the orientation of the optical axis Ax in the horizontal direction among the four lamp units 40.

As described above, the vehicular headlamp 10 according to this embodiment comprises the four lamp units 20 for forming the horizontal cut-off line CL1 positioned on the upper area of the low-beam distribution pattern P. Each of the lamp units 20 comprises the projection lens 22 disposed on the optical axis Ax extending in the longitudinal direction of the vehicle, and the semiconductor light-emitting element 24, having the light-emitting chip 24a with the lower end edge 24a1 formed linearly, disposed the lower end edge 24a1 of the light-emitting chip 24a on the optical axis Ax and in the rear of the projection lens 22 facing forward. Additionally, each of the lamp units 20 are configured to form a part of the horizontal cut-off line CL1 as an inverted projection image of the lower end edge 24a1 of the light-emitting chip 24a. The projection lens 22 is configured to project light from a point on the optical axis Ax at the lower end edge 24a1 of the light-emitting chip 24a as parallel light within a cross section perpendicular to the lower end edge 24a1 of the light-emitting chip 24a, while projecting light from a point on the optical axis Ax at the lower end edge 24a1 of the light-emitting chip 24a as diffused light within a cross section parallel to the lower end edge 24a1 of the light-emitting chip 24a. Thus, the small light distribution patterns P1a, P1b, P1c, and P1d can be obtained extending along the horizontal cut-off line CL1. Since this can be achieved through a simple optical system where the semiconductor light-emitting element 24 is merely disposed in the rear of the projection lens 22, light distribution for forming the horizontal cut-off line CL1 can be precisely and easily controlled.

According to this embodiment, the lamp unit 20 of the vehicular headlamp for forming the horizontal cut-off line CL1 is downsized, and allows the light distribution to be precisely controlled using a simple configuration.

Further, the projection lens 22 is integrally configured by the seal resin for sealing the light-emitting chip 24a of the semiconductor light-emitting element 24. Thus, no members are required for holding a predetermined positional relationship between the projection lens 22 and the semiconductor light-emitting element 24. Accordingly, the positional relationship between the projection lens 22 and the semiconductor light-emitting element 24 can be precisely set. This further facilitates formation of the horizontal cut-off line CL1. In addition, costs can be reduced through decrease in parts or components and the lamp unit 20 can be made even more downsized.

In this embodiment, the oblique cut-off line CL2 is formed by the four lamp units 30. Meanwhile, the lamp unit 30 has a similar configuration to the lamp unit 20. Thus, the lamp unit 30 for forming the horizontal cut-off line CL2 is configured in downsized, and precisely controls light distribution for forming the horizontal cut-off line CL2 using a simple configuration.

In this embodiment, the four lamp units 40 are provided for forming a diffusion zone, in addition to the lamp units 20 and 30. The lamp unit 40 has a similar configuration to the lamp units 20. Thus, it is possible to make the whole configuration of the vehicular headlamp 10 downsized.

In this embodiment, the center point in the horizontal direction of the lower end edges 24a1 and 44a1 of the light-emitting chips 24a and 44a are described as positioned on the focal point F of the projection lens 22. However, the light-emitting chips 24a and 44a may be configured such that another point of the lower end edges 24a1 and 44a1 is positioned on the focal point F of the projection lens 22.

In the present embodiment, the 4×3 lamp units 20, 30 and 40 are described as disposed on three vertical rows. However, the number of the lamp units, arrangement, and the like may be modified appropriately depending on the desired geometry of a light distribution pattern, light intensity distribution, and the like.

In this embodiment, the lamp units 20, 30, and 40 may includes a small reflector to reflect light forward from the light-emitting chips 24a and 44a in the proximity of the light-emitting chips 24a and 44a within the projection lens 22. In such a case, it is possible to improve the usability of a light from the light-emitting chips 24*a* and 44*a*. Thus, it is possible to improve the brightness of each small light distribution pattern.

Modified examples of the above embodiment will be described below.

Figure 11:
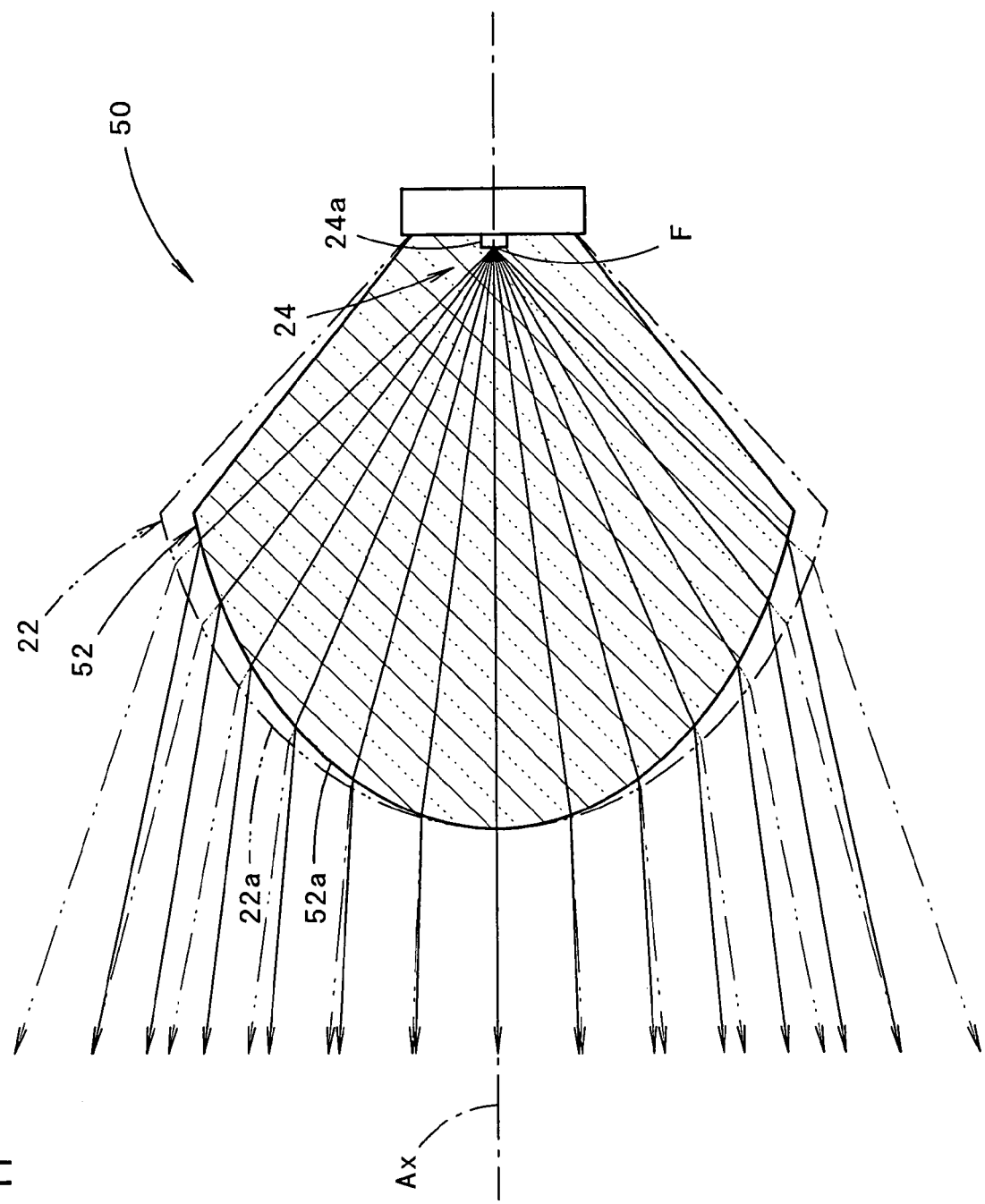
FIG. 11 is a cross-sectional plan view showing a lamp unit according to an embodiment of the present invention.

A first modified example of the above embodiment will be described. FIG. 11 is a cross sectional view showing a lamp unit 50 according to the present modification, as with FIG. 5.

As shown in the figure, the basic configuration of the lamp unit 50 is similar to that of the lamp unit 20, but the configuration of a projection lens 52 differs from that of the lamp unit 20.

Specifically, the refracting power of the projection lens 52 of the lamp unit 50 in a cross section parallel to the lower end edge 24*a*1 of the light-emitting chip 24*a* of the semiconductor light-emitting element 24 is set to a value smaller than that of the projection lens 22 of the above embodiment. More specifically, the curvature of a curve composing the horizontal cross section of a front-side top surface 52*a* of the projection lens 52 is set to a value larger than that of the above embodiment. Thus, the lamp unit 50 can suppress the diffusion angle of light from the light-emitting chip 24*a* within the cross section parallel to the lower end edge 24*a*1 of the light-emitting chip 24*a* of the semiconductor light-emitting element 24. In this case, the vertical cross-sectional shape including the optical axis Ax on the front-side top surface 52*a* of the projection lens 52, as with the front-side top surface 22*a* of the projection lens 22 of the above embodiment, is composed of a substantially elliptical arc-shaped curve having the focal point F at a center position in the horizontal direction of the lower end edge 24*a*1 of the light-emitting chip 24*a* of the semiconductor light-emitting element 24.

Figure 12:
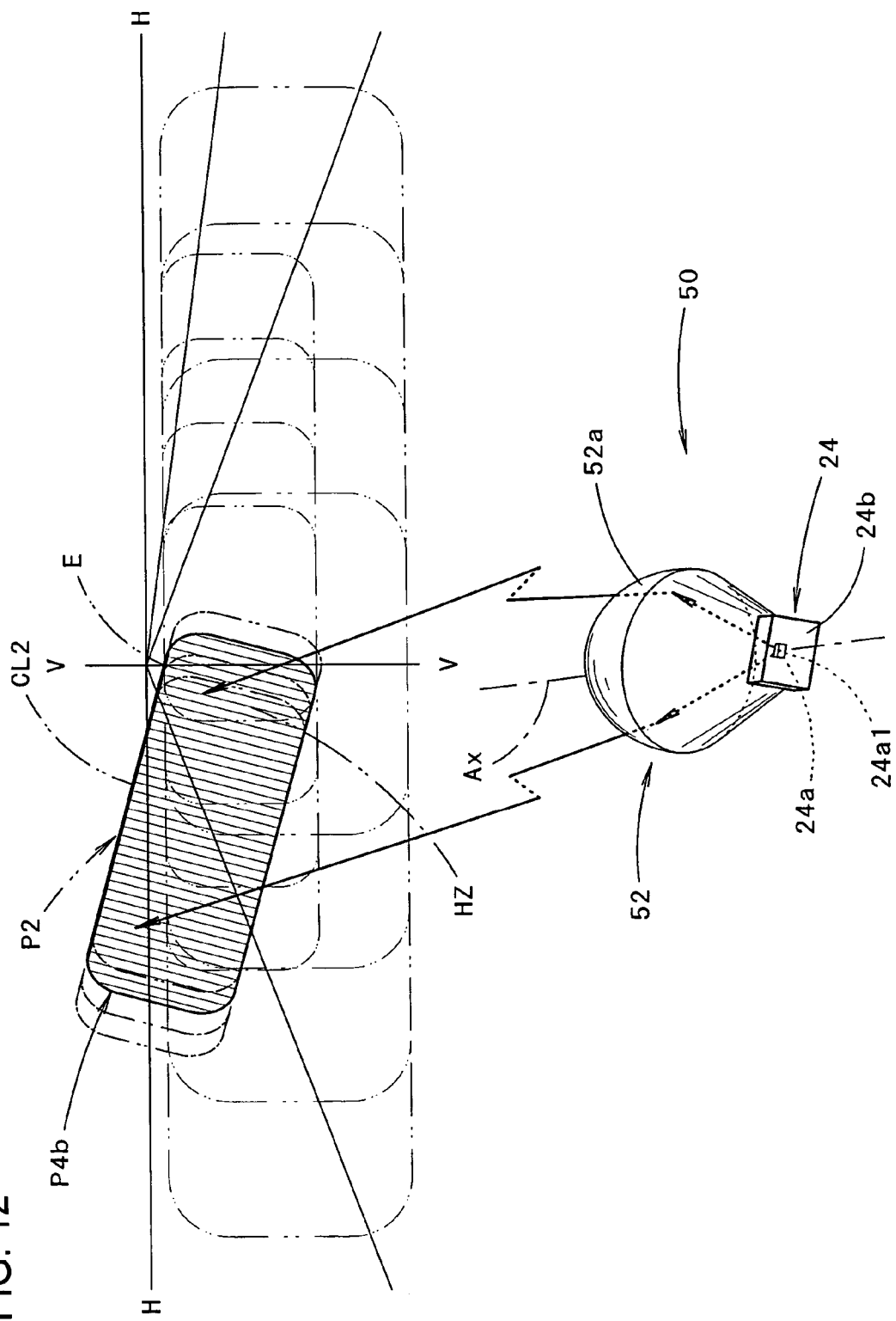
FIG. 12 is a perspective view showing the geometry of a light distribution pattern on the virtual vertical screen formed by light radiated from a lamp unit according to an embodiment of the present invention .

FIG. 12 is a perspective view from behind the modified lamp unit on the virtual vertical screen, showing a small light distribution pattern P4*b* formed by light radiated from the lamp unit 50 used instead of the lamp unit 30 for forming the oblique cut-off line.

As shown in the figure, the small light distribution pattern P4*b* formed by light radiated from the lamp unit 50 is a horizontally oblong light distribution pattern extending in the oblique direction due to the effect of the projection lens 52. However, the diffusion angle thereof is smaller than that of the small light distribution pattern P2*b* shown in FIG. 7.

By way of this, it is possible to generate high-intensity light by compressing the pattern P2 for forming an oblique cut-off line toward an elbow point E. Thus, this allows a hot zone HZ to be more brightened.

Additionally, instead of replacing all of the four lamp units 30 with the lamp units 50, one or more the lamp units 30 may be selectively replaced with one or more the lamp units 50.

Figure 13:
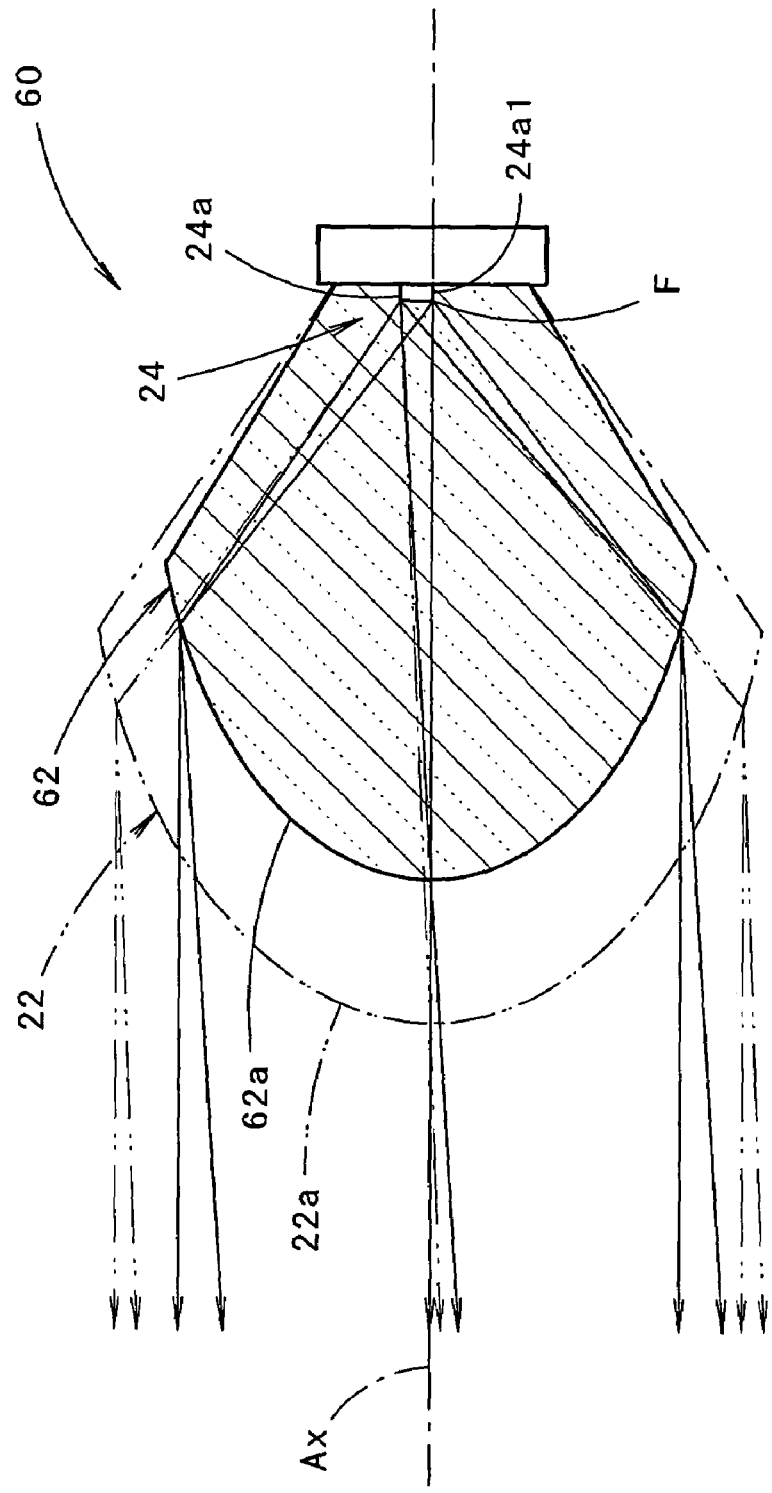
FIG. 13 is a cross-sectional side view showing a lamp unit according to an embodiment of the present invention.

A second modified example of the above embodiment will be described below. FIG. 13 shows a lamp unit 60 according to this modified example, as with FIG. 4.

As shown in the figure, the basic configuration of the lamp unit 60 is similar to that of the lamp unit 20 of the above embodiment, but the configuration of a projection lens 62 differs from that of the lamp unit 20.

Specifically, the projection lens 62 of the lamp unit 60 is smaller than the projection lens 22 (shown in the figure with a two-dot dashed line) of the above embodiment. A front-side surface 62*a* of the projection lens 62 is configured to narrow the front-side surface 22*a* of the projection lens 22 around the focal point F.

Thus, the projection lens 62, as with the projection lens 22, can project light from a point on the optical axis Ax of the lower end edge 24*a*1 of the light-emitting chip 24*a* as parallel light within a cross section perpendicular to the lower end edge 24*a*1 of the light-emitting chip 24*a*, while projecting light from a point on the optical axis Ax of the lower end edge 24*a*1 of the light-emitting chip 24*a* as diffused light within a cross section parallel to the lower end edge 24*a*1 of the light-emitting chip 24*a*. In addition, the predicted angle of the light-emitting chip 24*a* from the front-side surface 62*a* becomes larger than that of the projection lens 22. Accordingly, this enlarges the inverted projection image of the light-emitting chip 24*a*.

The lamp unit 60 of this modified example, for example, may substitute for the lamp units 40 for forming the diffusion zone of the above embodiment. Further, one ore more lamp units 60 may also substitute for one or more the lamp units 20 for forming a horizontal cut-off line.

Figure 14:
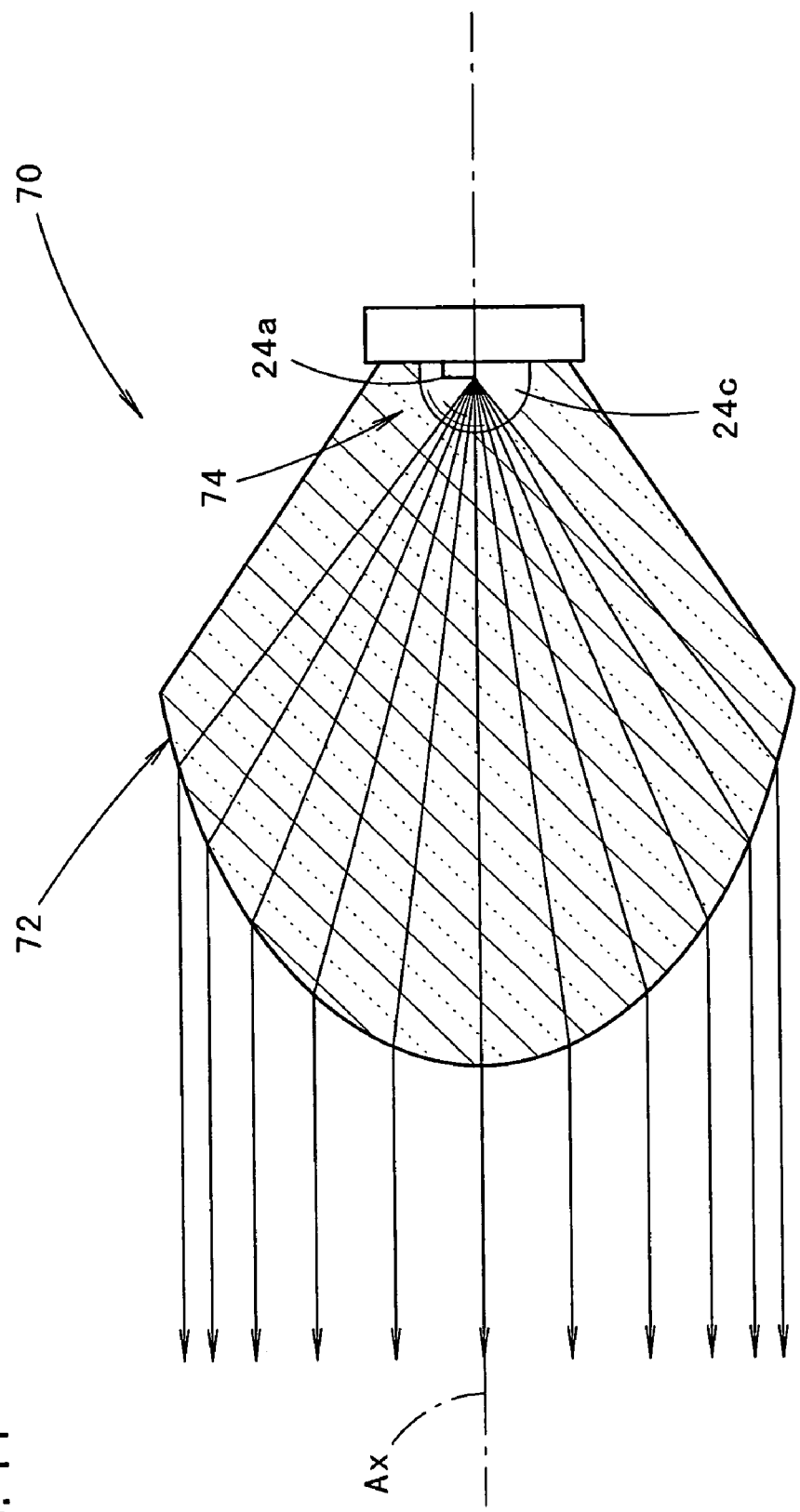
FIG. 14 is a cross-sectional side view showing a lamp unit according to an embodiment of the present invention.

A third modified example of the above embodiment will be described below. FIG. 14 shows a lamp unit 70 of this modified example, as with FIG. 4.

As shown in the figure, the basic configuration of the lamp unit 70 is similar that of the lamp unit 20 of the above embodiment, but the configuration of a projection lens 72 and a semiconductor light-emitting element 74 differs from that of the lamp unit 20.

Specifically, the semiconductor light-emitting element 74 of the lamp unit 70 is configured in a substantially semi-spherical shape to seal the light-emitting chip 24*a* by a seal resin 24*c*. In addition, the projection lens 72 is configured to cover the seal resin 24*c* of the semiconductor light-emitting element 74 from the front-side, and to integrate with the seal resin 24*c*.

This modified example can also have at least one of advantageous effects as mentioned above.

Figure 15:
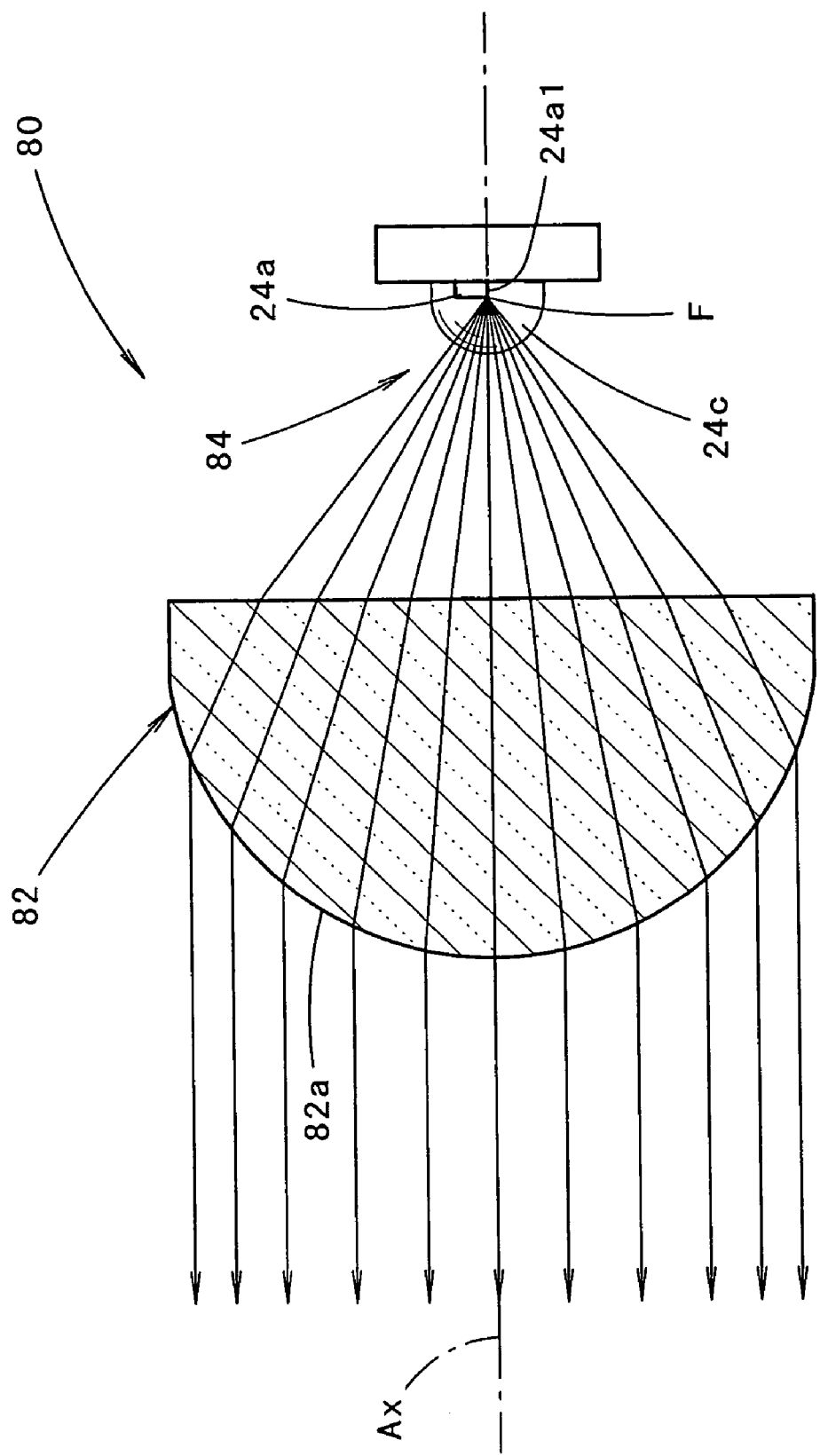
FIG. 15 is a cross-sectional side view showing a lamp unit according to an embodiment of the present invention.

A fourth modified example of the above embodiment will be described below. FIG. 15 shows a lamp unit 80 of this modified example, as with FIG. 4.

As shown in the figure, the lamp unit 80 is configured to fixedly joint a projection lens 82 and a semiconductor light-emitting element 84 together by a holder (not shown).

The projection lens 82 is configured by a plane-convex lens that a rear-side top surface of the projection lens 82 is formed in a flat plane perpendicular to the optical axis Ax, and that a front-side top surface 82*a* is formed in a horizontally long elliptical sphere. Further, the semiconductor light-emitting element 84 configured to seal the light-emitting chip 24*a* in the form of a substantially semispherical shape by the seal resin 24*c* and dispose the center position in the horizontal direction of the lower end edge 24*a*1 of the light-emitting chip 24*a* on the focal point F of the projection lens 82.

Thus, the lamp unit 80 of this modified example, as with the lamp unit 20 of the above embodiment, projects light radiated from a point on the optical axis Ax of the lower end edge 24*a*1 of the light-emitting chip 24*a* through the projection lens 82 as parallel light within a cross section perpendicular to the lower end edge 24*a*1 of the light-emitting chip 24*a*, while projecting light radiated from a point on the optical axis Ax of the lower end edge 24*a*1 of the light-emitting chip 24*a* through the projection lens 82 as diffused light within a cross section parallel to the lower end edge 24*a*1 of the light-emitting chip 24*a*.

This modified example can also have at least one of advantageous effects as mentioned above.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A lamp unit for a vehicular headlamp comprising:
a projection lens; and
a light-emitting element having a light-emitting chip with a lower end edge,
wherein the lower end edge is disposed on an optical axis of the projection lens in a rear of the projection lens, and
wherein the projection lens is configured to project light from a point on the optical axis at the lower end edge as parallel light within a plane perpendicular to the lower end edge chip, while projecting light from a point on the optical axis of the lower end edge as diffusion light within a plane parallel to the lower end edge.

2. The lamp unit according to claim 1, wherein the lower end edge is formed linearly.

3. The lamp unit according to claim 2, wherein a center point of the lower end edge is disposed on the optical axis.

4. The lamp unit according to claim 1, wherein the lower end edge extends in a horizontal direction.

5. The lamp unit according to claim 1, wherein the lower end edge extends in a direction inclined at a predetermined angle with respect to a horizontal direction.

6. The lamp unit according to claim 1, wherein the projection lens is configured to integrate with seal resin to seal the light-emitting chip.

7. The lamp unit according to claim 6, wherein the seal resin serves as the projection lens.

8. The lamp unit according to claim 1, wherein a front portion of the projection lens is configured in a substantially ellipsoid spherical shape and a rear portion of the projection lens is configured in a substantially ellipsoid conical shape.

9. The lamp unit according to claim 1, wherein a shape of a vertical cross section of the projection lens including the optical axis is composed of a substantially elliptical arc-shaped curve, and a shape of a horizontal cross section of the projection lens including the optical axis is composed of a substantially elliptical arc-shaped curve having a smaller curvature than that of the shape in the vertical cross section.

10. A vehicular headlamp comprising a plurality of lamp units, wherein each of the plurality of lamp units comprises:
a projection lens; and
a light-emitting element having a light-emitting chip with a lower end edge,
wherein the lower end edge is disposed on an optical axis of the projection lens in a rear of the first projection lens, and
wherein the projection lens is configured to project light from a point on the optical axis at the lower end edge as parallel light within a plane perpendicular to the lower end edge chip, while projecting light from a point on the optical axis of the lower end edge as diffusion light within a plane parallel to the lower end edge.

11. The vehicular headlamp according to claim 10, wherein a first lower end edge of a first projection lens linearly extends in a horizontal direction, and a second lower end edge of a second projection lens linearly extends in a direction inclined at a predetermined angle with respect to the horizontal direction.

12. The vehicular headlamp according to claim 10, wherein a first projection lens and a second projection lens are in different refracting powers within the plane parallel to the lower end edge thereof.

13. The vehicular headlamp according to claim 10, wherein a first projection lens and a second projection lens are in different sizes.

14. The vehicular headlamp according to claim 11, wherein light-emitting chips of a first light-emitting element and a second light-emitting element are in different sizes.

15. A vehicular headlamp comprising:
a first lamp unit; and
a second lamp unit,
wherein the first lamp unit comprises:
a first projection lens; and
a first light-emitting element having a light-emitting chip with a lower end edge that extends in a horizontal direction,
wherein the lower end edge is disposed on an optical axis of the first projection lens in a rear of the first projection lens, and
wherein the first projection lens is configured to project light from a point on the optical axis at the lower end edge as parallel light within a plane perpendicular to the lower end edge chip, while projecting light from a point on the optical axis of the lower end edge as diffusion light within a plane parallel to the lower end edge, and
wherein the second lamp unit comprises:
a second projection lens; and
a second light-emitting element having a light-emitting chip with a lower end edge that extends in a direction inclined at a predetermined angle with respect to the horizontal direction,
wherein the lower end edge is disposed on an optical axis of the second projection lens in a rear of the second projection lens, and
wherein the second projection lens is configured to project light from a point on the optical axis at the lower end edge.

* * * * *